United States Patent
Otsubo

(10) Patent No.: US 9,380,699 B2
(45) Date of Patent: Jun. 28, 2016

(54) CERAMIC MULTILAYER SUBSTRATE AND METHOD FOR MANUFACTURING THE SAME

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 308 days.

(21) Appl. No.: 13/751,358

(22) Filed: Jan. 28, 2013

(65) Prior Publication Data

US 2014/0036467 A1     Feb. 6, 2014

Related U.S. Application Data

(63) Continuation of application No. PCT/JP2011/066061, filed on Jul. 14, 2011.

(30) Foreign Application Priority Data

Jul. 29, 2010 (JP) ................................. 2010-170396

(51) Int. Cl.
*H05K 1/03* (2006.01)
*H05K 1/02* (2006.01)
(Continued)

(52) U.S. Cl.
CPC ............... *H05K 1/0298* (2013.01); *H05K 3/00* (2013.01); *H05K 3/4629* (2013.01); *H05K 2201/0187* (2013.01); *H05K 2201/09136* (2013.01); *H05K 2201/09672* (2013.01)

(58) Field of Classification Search
CPC .................... H05K 1/0298; H05K 2201/0187; H05K 2201/09136; H05K 2201/09672; H05K 3/00; H05K 3/4629

USPC .......... 174/260–262, 255; 361/792–795, 760; 257/698, 778

See application file for complete search history.

(56) References Cited

U.S. PATENT DOCUMENTS

| | | | | |
|---|---|---|---|---|
| 5,508,665 | A | * | 4/1996 | Chan et al. ................ 331/117 D |
| 5,866,240 | A | * | 2/1999 | Prabhu et al. ................. 428/210 |

(Continued)

FOREIGN PATENT DOCUMENTS

| | | |
|---|---|---|
| JP | 2007-335732 A | 12/2007 |
| JP | 2008-135523 A | 6/2008 |

(Continued)

OTHER PUBLICATIONS

Official Communication issued in International Patent Application No. PCT/JP2011/066061, mailed on Oct. 25, 2011.

*Primary Examiner* — Yuriy Semenenko
(74) *Attorney, Agent, or Firm* — Keating & Bennett, LLP

(57) ABSTRACT

A ceramic multilayer substrate includes stacked ceramic layers; internal conductors which are stacked with one of the ceramic layers therebetween, and are arranged such that at least a portion of the internal conductors overlap each other in a stacking direction; and a constraining layer which is arranged on a layer different from layers on which the internal conductors are located. The constraining layer overlaps, in the stacking direction, an internal conductor-overlapping region where at least two of the internal conductors overlapping each other in the stacking direction, has a planar area not more than twice the planar area of the internal conductor-overlapping region, and contains an unsintered inorganic material powder. The constraining layer has a planar area not more than one-half the planar area of the ceramic layers. The constraining layer is arranged so as to entirely cover the internal conductor-overlapping region.

19 Claims, 4 Drawing Sheets

(51) Int. Cl.
   *H05K 3/46*   (2006.01)
   *H05K 3/00*   (2006.01)

(56) References Cited

U.S. PATENT DOCUMENTS

| | | | |
|---|---|---|---|
| 6,207,234 B1* | 3/2001 | Jiang | 427/333 |
| 2006/0081977 A1 | 4/2006 | Sakai et al. | |
| 2007/0187137 A1* | 8/2007 | Isebo | 174/255 |
| 2009/0068426 A1 | 3/2009 | Nishizawa | |
| 2009/0116662 A1* | 5/2009 | Wu | 381/94.2 |
| 2009/0272566 A1* | 11/2009 | Nomiya et al. | 174/257 |

FOREIGN PATENT DOCUMENTS

| | | |
|---|---|---|
| JP | 2009-181987 A | 8/2009 |
| WO | 2005/067359 A1 | 7/2005 |
| WO | 2007/145189 A1 | 12/2007 |

* cited by examiner

CERAMIC MULTILAYER SUBSTRATE AND METHOD FOR MANUFACTURING THE SAME

BACKGROUND OF THE INVENTION

1. Field of the Invention

The present invention relates to ceramic multilayer substrates and methods for manufacturing the same and particularly relates to a ceramic multilayer substrate having good surface planarity and excellent component mountability, and a method for manufacturing the same.

2. Description of the Related Art

In recent years, ceramic multilayer substrates having wiring conductors that are three-dimensionally arranged have been widely used for various applications.

The following substrate has been proposed as one of the ceramic multilayer substrates: a ceramic multilayer substrate having a configuration in which via-hole conductors and internal conductors are provided in a laminate including a plurality of stacked ceramic layers, in which external conductors are located on surfaces thereof, and in which the internal conductors are connected to the external conductors through the via-hole conductors (see, for example, WO 2005/067359).

In ceramic multilayer substrates having such a configuration as disclosed in WO 2005/067359, ceramic layers tend to be thin and internal circuit elements tend to be densely arranged because compact and high-performance electronic components are demanded.

However, a region where internal conductors are arranged so as to overlap each other in a stacking direction has a more convex substrate surface as compared to a region where no internal conductors are provided and therefore the planarity (coplanarity) of a ceramic multilayer substrate is impaired. This results in a problem that when electronic components (surface-mount components) are mounted on a surface of the ceramic multilayer substrate, the failure of component mounting occurs.

SUMMARY OF THE INVENTION

Preferred embodiments of the present invention provide a ceramic multilayer substrate having superior surface planarity and excellent component mountability and also provide a method capable of efficiently manufacturing such a ceramic multilayer substrate.

A ceramic multilayer substrate according to a preferred embodiment of the present invention includes a plurality of stacked ceramic layers; a plurality of internal conductors which are stacked on each other with one of the ceramic layers therebetween, and are arranged such that at least portions of the plurality of internal conductors overlap each other in a stacking direction; and a constraining layer which is located on a layer that is different from layers containing the internal conductors, wherein the constraining layer is arranged to overlap, in the stacking direction, an internal conductor-overlapping region where at least two of the internal conductors overlapping each other in the stacking direction overlap each other, the constraining layer has a planar area not more than twice the planar area of the internal conductor-overlapping region (the constraining layer has a planar area that is double the planar area of the internal conductor-overlapping region or less), and the constraining layer contains an unsintered inorganic material powder.

In a preferred embodiment of the present invention, in a region where the coplanarity of a substrate surface is intended to be particularly ensured, the constraining layer is preferably arranged so as to overlap the internal conductor-overlapping region in the stacking direction. However, in a region where the coplanarity of a substrate surface need not be particularly ensured, even if the internal conductor-overlapping region where internal electrodes overlap each other in the stacking direction is present, the constraining layer can be arranged so as not to overlap the internal conductor-overlapping region in the stacking direction.

In the ceramic multilayer substrate according to a preferred embodiment of the present invention, the constraining layer preferably has a planar area not more than one-half the planar area of the ceramic layers, that is, the constraining layer preferably has a planar area that is half of the planar area of the ceramic layers or less.

The constraining layer is preferably arranged so as to entirely cover the internal conductor-overlapping region in the stacking direction.

The constraining layer is preferably arranged in a portion which is one of a plurality of portions between a substrate surface and the internal conductors that are elements that should overlap each other in the stacking direction and in which the distance between the substrate surface and one of the internal conductors is relatively small and smaller than other such distances.

The internal conductors overlapping each other in the stacking direction are preferably coil conductors.

The ceramic layers are preferably made of a ceramic material containing a glass component.

A method for manufacturing a ceramic multilayer substrate according to another preferred embodiment of the present invention includes (a) a step of preparing a green laminate including a plurality of substrate ceramic green layers containing a substrate ceramic material powder, internal conductors being arranged on at least two of the substrate ceramic green layers, and at least a portion of one of the internal conductors arranged on one of the substrate ceramic green layer overlaps another internal conductor arranged on another substrate ceramic green layer in the stacking direction, and a constraining layer which is located on a layer that is different from layers on which the internal conductors are located, wherein the constraining layer overlaps, in the stacking direction, an internal conductor-overlapping region where at least two of the internal conductors overlapping each other in the stacking direction overlap each other, the constraining layer has a planar area not more than twice the planar area of the internal conductor-overlapping region, and the constraining layer contains an inorganic material powder that is not sintered at the sintering temperature of the substrate ceramic material powder; and (b) a step of firing the green laminate at a temperature at which the inorganic material powder is not sintered but the substrate ceramic material powder is sintered.

In the ceramic multilayer substrate manufacturing method according to a preferred embodiment of the present invention, the constraining layer is preferably formed by applying an inorganic material paste containing the inorganic material powder to the substrate ceramic green layer.

A ceramic multilayer substrate according to a preferred embodiment of the present invention includes a plurality of stacked ceramic layers; a plurality of internal conductors which are stacked with one of the ceramic layers disposed therebetween, and are arranged such that at least a portion of the plurality of internal conductors overlap each other in a stacking direction; and a constraining layer which is located on a layer that is different from layers on which the internal conductors are located, wherein the constraining layer overlaps, in the stacking direction, an internal conductor-overlapping region where at least two of the internal conductors overlapping each other in the stacking direction overlap each other, and the constraining contains an unsintered inorganic material powder. Therefore, a substrate surface that is excellent in coplanarity (planarity) can be efficiently planarized.

The reasons why the coplanarity of a substrate surface is improved by various preferred embodiments of the present invention are described below.

In the case of manufacturing the ceramic multilayer substrate, with a laminate (an unfired laminate to be converted into the ceramic multilayer substrate after firing) formed by stacking and pressing ceramic green sheets on which conductor patterns to be converted into internal conductors, for example, in an upper region and lower region where the internal conductors are arranged, the ceramic green sheets are more strongly pressed than another region and therefore are reduced in thickness.

In regions where the sintering density of ceramic layers becomes constant after firing, that is, the upper region and lower region where the internal conductors are arranged, a region which is more strongly pressed than another region and which is therefore reduced in thickness has a thickness that is equal or substantially equal to that of another region. As a result, convex bumps are provided on a substrate surface. In particular, in the case where the internal conductors are stacked so as to overlap each other in a stacking direction, the convex bumps are accumulated and therefore the coplanarity of the substrate surface is significantly reduced.

However, in a preferred embodiment of the present invention, a ceramic layer of a portion in which a constraining layer is located hardly shrinks in a direction parallel or substantially parallel to a principal surface thereof but shrinks significantly only in a thickness direction. Therefore, the coplanarity of a substrate surface can be improved such that the constraining layer is arranged so as to overlap the internal conductor-overlapping region in the stacking direction and such that a ceramic layer of a portion overlapping the constraining layer is caused to shrink significantly in the thickness direction in a firing step.

In the case where, for example, external conductor patterns and internal conductor patterns are formed by applying a conductive paste containing a conductive component such as Ag or Cu to low-temperature co-fired ceramic green sheets, mainly including a low-temperature co-sintered ceramic material containing a glass component, for ceramic layers, a laminate is formed by stacking the low-temperature co-fired ceramic green sheets, and a ceramic multilayer substrate is manufactured by performing a process of co-firing (simultaneously firing) the laminate, a conductor material (the conductive paste) and the ceramic material which are different in shrinkage behavior from each other.

For the conductor material, an organic substance, such as a binder resin, contained in the conductor material preferably is thermally decomposed at about 300-400° C. after the beginning of firing, a metal component such as Ag or Cu is sintered to begin to shrink, and sintering shrinkage then ends at about 700-800° C.

On the other hand, in the low-temperature co-fired ceramic green sheets, which mainly include glass or ceramic, sintering shrinkage starts at about 500° C. or higher, which is about 100° C. or higher than that of the conductor material, and ends at about 900-1,000° C.

That is, in a temperature range where the ceramic material shrinks due to sintering, the sintering shrinkage of the conductive material (the internal conductors) substantially ends.

Thus, in the sintering shrinkage temperature range of the ceramic material, the conductive material (the internal conductors), in which sintering shrinkage has already ended and no longer proceeds, acts to resist (push against) shrinkage and a constraining layer which is located on a layer that is different from the internal conductors so as to overlap an internal conductor-overlapping region does not shrink in a direction parallel or substantially parallel to a principal surface thereof. As a result, the warpage and convex protrusion of the ceramic layers are significantly reduced and prevented.

The constraining layer is preferably arranged so as to entirely cover the internal conductor-overlapping region as described below. When the constraining layer is arranged so as to partly overlap the internal conductor-overlapping region, the constraining layer can absorb the deformation of the ceramic layers due to the partial overlap of the internal conductors and therefore can contribute to the improvement of coplanarity.

When the planar area of the constraining layer is more than twice the planar area of the internal conductor-overlapping region, the ceramic layers around the internal conductors are significantly recessed and cracks may possibly be caused. Therefore, the planar area of the constraining layer is preferably not more than twice the planar area of the internal conductor-overlapping region.

When the planar area of the constraining layer is not more than one-half the planar area of the ceramic layers, a ceramic multilayer substrate that has significantly less strain or warpage and is excellent in coplanarity can be reliably obtained.

The term "planar area of constraining layer" as used herein refers to:

(a) when a single constraining layer only is provided, the planar area thereof, (b) when a plurality of constraining layers are two-dimensionally arranged and do not overlap each other, the sum of the area of the constraining layers, or (c) when a plurality of constraining layers are two-dimensionally arranged and some of the constraining layers overlap each other in a stacking direction, the area of a region where the constraining layers are arranged when viewed along the main surface thereof, that is, the value (the value of the overlapping area of a region where the internal conductors overlap each other, the overlap area is not multiplied by the number of the overlapping constraining layers) of the area of the projection domain of the internal conductors.

When the constraining layer is arranged so as to entirely cover the internal conductor-overlapping region in the stacking direction, the constraining layer can sufficiently and reliably absorb the deformation of the ceramic layers due to the overlap of the internal conductors to improve the coplanarity of the ceramic multilayer substrate.

When the constraining layer is arranged so as to partly cover or partly overlap the internal conductor-overlapping region, the coplanarity is improved to some extent as described above.

The coplanarity can be more reliably improved such that the constraining layer is arranged in a portion which is one of portions between a substrate surface and the internal conductors that are elements that should overlap each other in the stacking direction and in which the distance between the substrate surface and one of the internal conductors is relatively small and smaller than other such distances.

That is, convex bumps caused by the influence of the internal conductors overlapping in the stacking direction are likely to be formed on a substrate surface closer to the internal conductors. Therefore, the convex bumps are efficiently prevented from being formed on the substrate surface such that the constraining layer is arranged in the portion in which the distance between the substrate surface and one of the internal conductors is relatively small and smaller than other such distances and which is one of the portions between the substrate surface and the internal conductors that are elements which should overlap each other in the stacking direction such that the coplanarity can be enhanced.

When the constraining layer is arranged between the internal conductors with about three or four of the ceramic layers disposed therebetween, the three or four ceramic layers between the constraining layer and the internal conductors shrink significantly in a thickness direction in a firing step. Therefore, the deformation of the ceramic layers due to the overlap of the internal conductors can be reliably absorbed.

In the case of forming a coil by arranging coil conductors in a ceramic multilayer substrate, the coil conductors (internal conductors), which preferably have the same shape, are arranged so as to overlap each other in the stacking direction and therefore a region of a substrate surface that corresponds to a region where the coil conductors are provided is likely to protrude to be convex. Applying a preferred embodiment of the present invention to such a ceramic multilayer substrate allows a ceramic multilayer substrate that is excellent in coplanarity to be obtained, which is particularly advantageous.

In the case of using a ceramic material containing a glass component to form the ceramic layers, a ceramic multilayer substrate having high properties can be efficiently manufactured through a firing step at a relatively low temperature of, for example, about 1,000° C. or lower, which is particularly advantageous.

The glass component diffuses from the ceramic layers into the constraining layer to increase the bonding strength between the constraining layer and the ceramic layers and the constraining layer prevents the ceramic layers from shrinking in a direction parallel or substantially parallel to a principal surface thereof. As a result, the shrinkage of the ceramic layers in a thickness direction thereof is promoted, the deformation (the increase in thickness) of the ceramic layers in a firing step is absorbed, and the coplanarity is significantly enhanced, which is advantageous.

A method for manufacturing a ceramic multilayer substrate according to another preferred embodiment of the present invention includes preparing a green laminate including a plurality of substrate ceramic green layers containing a substrate ceramic material powder; internal conductors being arranged on at least two of the substrate ceramic green layers, and at least a portion of one of the internal conductors arranged on one of the substrate ceramic green layer overlaps another internal conductor located on another substrate ceramic green layer in the stacking direction; and a constraining layer which is arranged on a layer different from layers on which the internal conductors are located, wherein the constraining layer overlaps, in the stacking direction, an internal conductor-overlapping region where at least two of the internal conductors overlapping each other in the stacking direction overlap each other, the constraining layer has a planar area not more than twice the planar area of the internal conductor-overlapping region, and the constraining layer contains an inorganic material powder that is not sintered at the sintering temperature of the substrate ceramic material powder and also includes firing the green laminate at a temperature at which the inorganic material powder is not sintered but the substrate ceramic material powder is sintered. Therefore, a ceramic multilayer substrate that has excellent substrate surface coplanarity can be efficiently manufactured.

In the case of forming the constraining layer by applying an inorganic material paste containing the inorganic material powder to one of the ceramic layers, the constraining layer can be readily formed so as to have an arbitrary shape. This allows a preferred embodiment of the present invention to be more effective.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Features of the present invention are described below in detail with reference to preferred embodiments of the present invention.

First Preferred Embodiment

Figure 1:
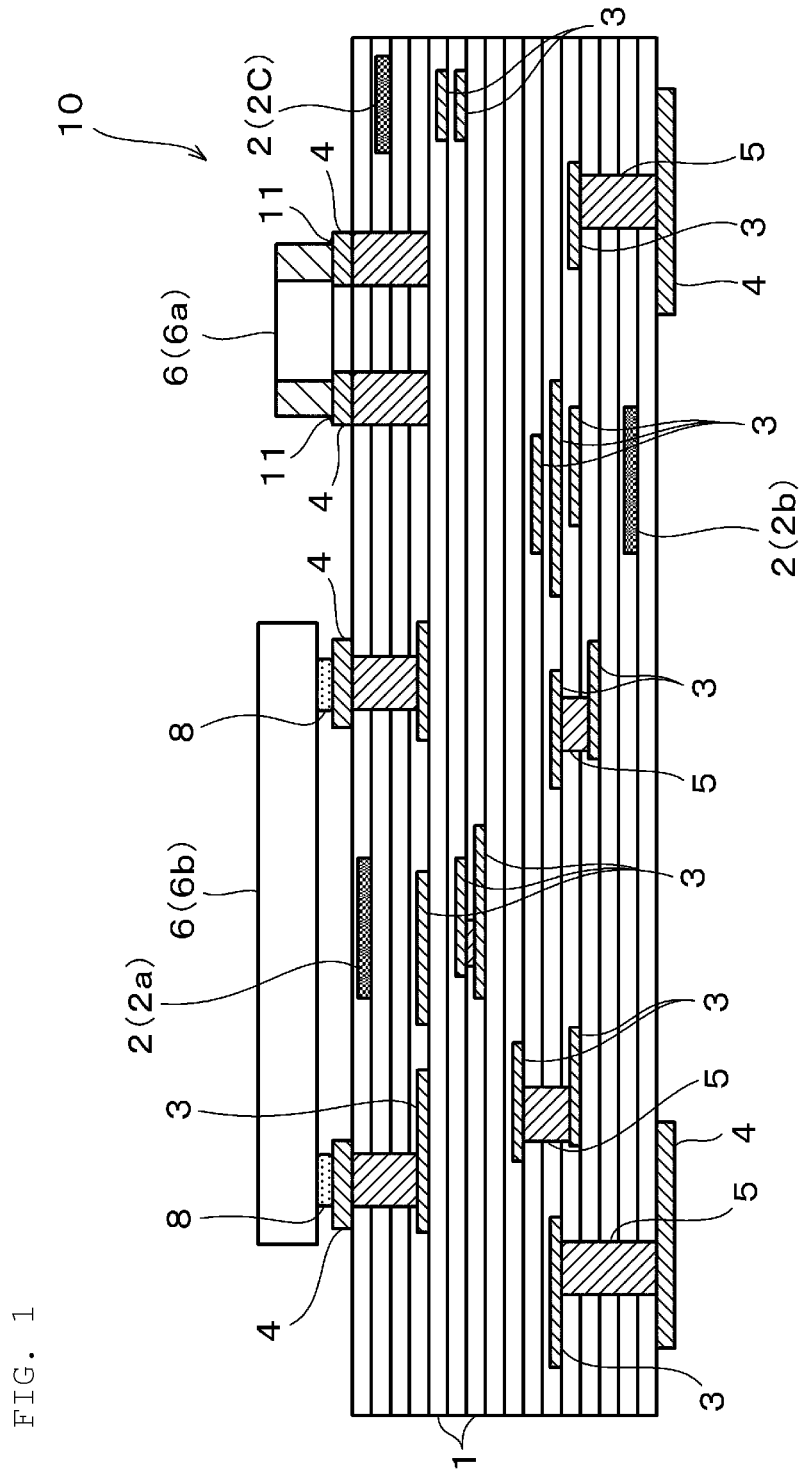
FIG. 1 is a schematic view illustrating the configuration of a ceramic multilayer substrate according to a first preferred embodiment of the present invention.

FIG. 1 is a schematic view illustrating the configuration of a ceramic multilayer substrate according to a first preferred embodiment of the present invention.

The ceramic multilayer substrate 10 includes ceramic layers 1 that are base layers, internal conductors 3 arranged between the layers, external conductors 4 located on surfaces of the substrate 10, and via-hole conductors 5 to achieve interlayer connection. The internal conductors 3 and external conductors 4 located on different layers are electrically connected to each other through the via-hole conductors 5.

Constraining layers 2 containing an inorganic material powder which is substantially unsintered are arranged on layers that are different from layers on which the internal conductors 3 are located so as to overlap, in a stacking direction, a region (an internal conductor-overlapping region) where at least two of the internal conductors 3 overlapping each other in the stacking direction overlap each other.

In the ceramic multilayer substrate 10 according to the first preferred embodiment, the constraining layers 2 are preferably provided at three locations, for example. The constraining layers 2 (2a, 2b, and 2c) are preferably configured so as to have a planar area that is not more than twice the planar area of the internal conductor-overlapping region.

The positions and number of the constraining layers 2 are not particularly limited and can be set as required.

A surface mount-type electronic component 6a and semiconductor element 6b are mounted on a surface of the ceramic multilayer substrate 10.

The electronic component 6a is mechanically and/or electrically connected to the external conductors 4 with solders therebetween. The semiconductor element 6b is electrically connected to the external conductors 4 with solder balls 8 therebetween.

In the ceramic multilayer substrate 10, the ceramic layers 1, which are base layers, control substrate properties of the ceramic multilayer substrate 10.

The thickness (the thickness after firing) of the ceramic layers 1 preferably ranges from about 5 μm to about 100 μm, for example.

The following material is advantageously used to form the ceramic layers 1: a low-temperature co-sintered ceramic material, including glass, capable of being sintered at a relatively low temperature of, for example, about 1,000° C. or lower. The following composition can be used as a ceramic material capable of being sintered at low temperature: for example, a composition, such as a mixture of barium oxide, silicon oxide, alumina, calcium oxide, and boron oxide, producing glass in a firing step. Instead, the following mixture can be used: a mixture of ceramic, such as alumina, serving as filler and borosilicate glass or glass, such as silicon oxide, acting as a sintering aid.

A composition containing an unsintered inorganic material which is not sintered at the sintering temperature of the ceramic material used to form the ceramic layers 1 and which has a high sintering temperature is used to form the constraining layers 2. The following powder can be used: for example, a powder of an oxide inorganic material such as alumina, zirconia, magnesia, mullite, or quartz; a powder of a non-oxide inorganic material such as boron nitride; or the like.

The internal conductors are usually formed such that internal conductor patterns, formed preferably by printing using a conductive paste, having a predetermined shape are fired together in a step of firing the ceramic layers. The conductive paste, which is used to form the internal conductors, is a pasty one in which, for example, a powder of a metal or alloy such as Ag, Ag—Pd, Ag—Pt, Cu, Au, Pt, or Al is a major component of a conductive material and which is prepared by dispersing such a metal powder in an organic vehicle.

Figure 2A:
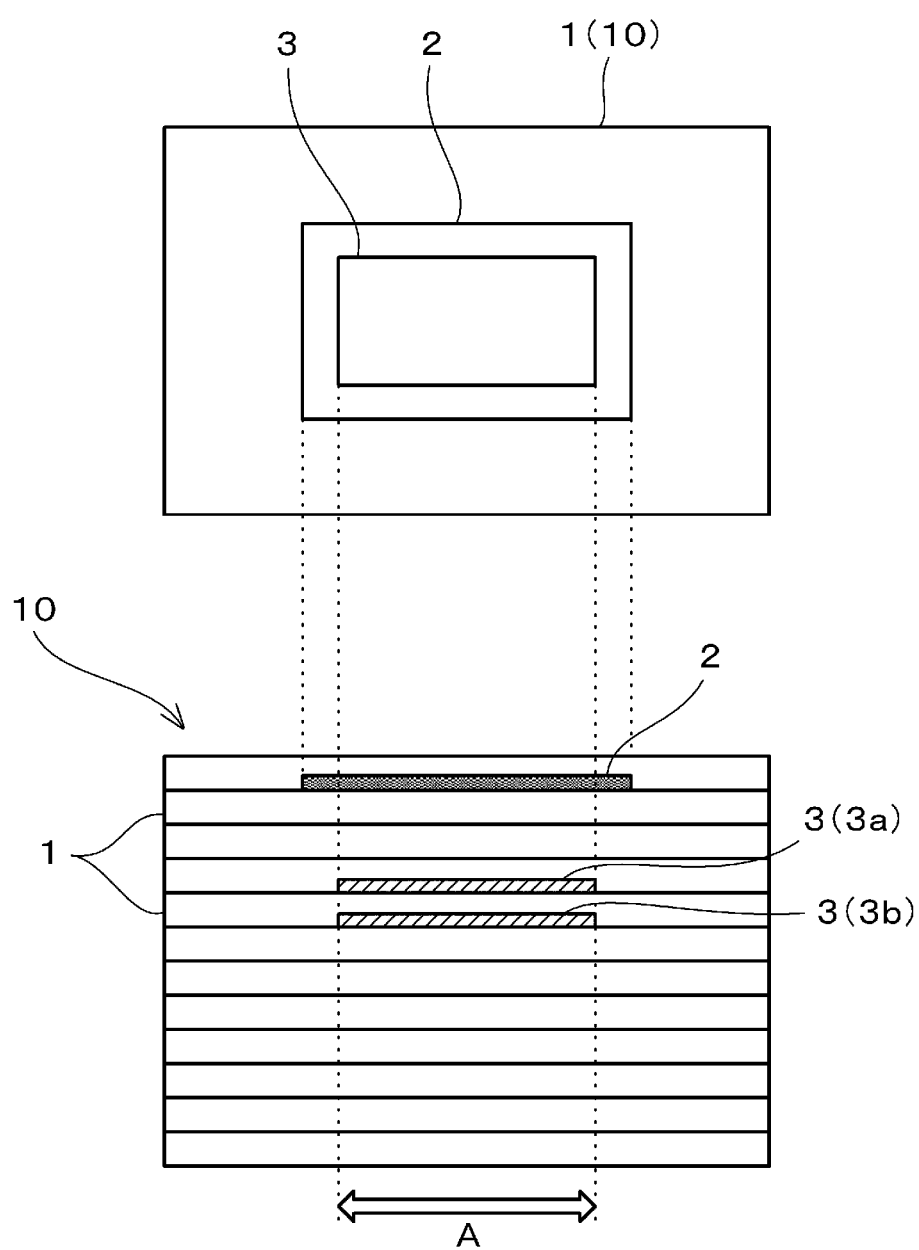
FIG. 2A is an illustration of an internal conductor-overlapping region in the ceramic multilayer substrate according to the first preferred embodiment of the present invention.

In the ceramic multilayer substrate 10 according to the first preferred embodiment, when the two internal conductors 3 (3a and 3b) are arranged so as to face each other with one of the ceramic layers 1 therebetween, a region occupied by the internal conductor 3a is equal to the proportion of the internal conductor 3b in plan view. As a result, "an internal conductor-overlapping region where at least two of the internal conductors overlapping each other in a stacking direction overlap each other" corresponds to a region (that is, a region indicated by "A" in FIG. 2A) where the internal conductor 3a or 3b is located, as described with reference to FIG. 2A, which schematically shows the arrangement of the internal conductors and the constraining layers. In this case, when even three or more of the internal conductors 3 are arranged so as to face each other, the "internal conductor-overlapping region A" is the same as the case where the number of the internal conductors is two.

Figure 2B:
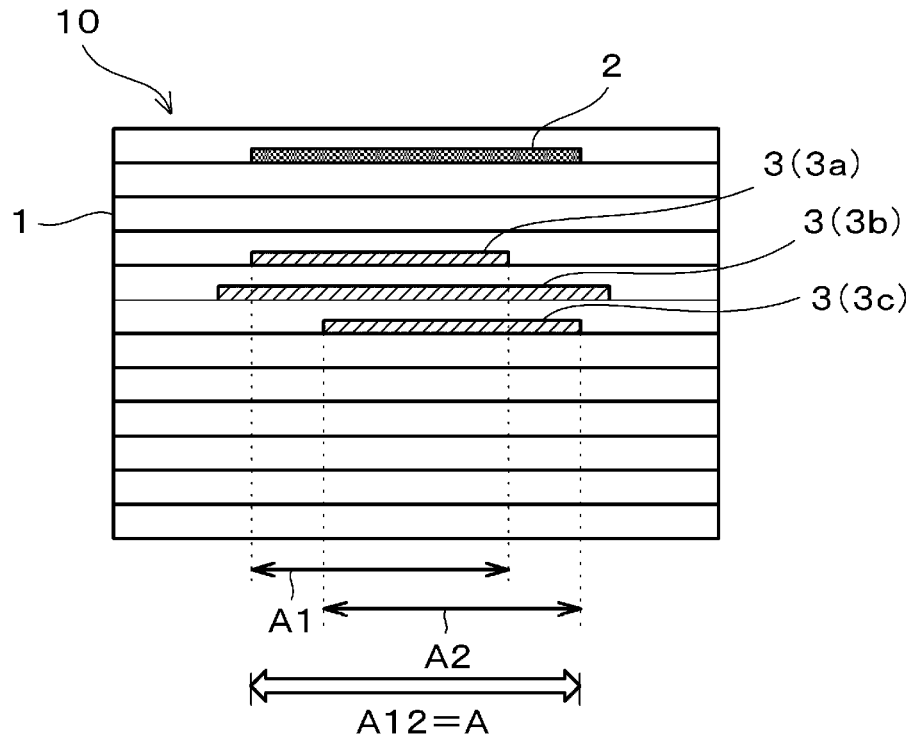
FIG. 2B is another illustration of an internal conductor-overlapping region in the ceramic multilayer substrate according to the first preferred embodiment of the present invention.

On the other hand, when, for example, the three internal conductors 3 (3a, 3b, and 3c) are arranged with the ceramic layers 1 therebetween, the upper and lower internal conductors 3a and 3c are displaced from each other in a direction perpendicular or substantially perpendicular to the stacking direction, and the central internal conductor 3b is located in a region wider than the internal conductors 3a and 3c so as to overlap the internal conductors 3a and 3c in the stacking direction as shown in FIG. 2B, a region A12 including both a region A1 where the internal conductors 3a and 3b overlap each other and a region A2 where the internal conductors 3b and 3c overlap each other corresponds to the "internal conductor-overlapping region A".

A non-limiting example of a method for manufacturing the ceramic multilayer substrate 10, according to the first preferred embodiment, having such a configuration as shown in FIG. 1 is described below.

In order to manufacture the ceramic multilayer substrate 10, a plurality of substrate ceramic green sheets which are to be formed into the ceramic layers 1 and which have a thickness of about 5 μm to about 100 μm, for example, are prepared.

Next, through-holes that define the via-hole conductors 5 are formed in the predetermined substrate ceramic green sheets. A conductive paste is filled into the through-holes such that the via-hole conductors 5 are formed.

Predetermined patterns are printed on the predetermined substrate ceramic green sheets using the conductive paste such that conductive films to be formed into the internal conductors or external conductors are formed.

Constraining layer patterns having a predetermined pattern and a thickness of about 1 μm to about 10 μm are each formed at a position corresponding to the internal conductor-overlapping region where at least two of the internal conductors overlapping each other in the stacking direction overlap each other.

The constraining layers are preferably formed by printing using an inorganic material paste for forming the constraining layers. A major component of the inorganic material paste is a powder of a sintering-resistant inorganic material, such as powdery alumina, which is substantially not sintered at the sintering temperature of a ceramic material used to form the substrate ceramic green sheets.

The following material can be used as another inorganic material: a material, such as zirconium, which is substantially not sintered at the sintering temperature of the ceramic material used to form the substrate ceramic green sheets.

The substrate ceramic green sheets having one or more of the via-hole conductors, conductive films, and constraining layer patterns formed as described above and the substrate ceramic green sheets having none of them are stacked and are then pressed such that a laminate to be formed into the ceramic multilayer substrate, which has such a configuration as shown in FIG. 1, after firing is formed.

For example, an isostatic pressing process is preferably used to press the laminate.

Next, the pressed laminate, which is formed as described above, is fired at a temperature at which an inorganic material powder used to form the constraining layers 2 is not substantially sintered but a powder of the ceramic material used to form the substrate ceramic green sheets is sintered. In particular, firing is performed at a maximum temperature of about 900° C. to about 1,000° C. in a reducing atmosphere, for example. In a firing step, the ceramic layers in a portion in which the constraining layers are located hardly shrink in a direction parallel or substantially parallel to a principal surface thereof but significantly shrink in a thickness direction. As a result, the deformation of the ceramic layers is absorbed and a substrate surface is prevented from protruding convexly.

In the firing step, in order to prevent the warpage and/or deformation of the laminate, the laminate may be fired such that the laminate is pressed in the stacking direction.

This allows the ceramic multilayer substrate (the ceramic multilayer substrate having none of the electronic component 6a, the semiconductor element 6b, and the like) 10 having such a configuration as shown in FIG. 1 to be obtained.

In the ceramic multilayer substrate 10, the constraining layers 2 (2a, 2b, and 2c) are preferably provided at three locations, in total, between the stacked ceramic layers 1 as described above.

The constraining layer 2 (2a) is arranged to correspond to three of the internal conductors 3 located thereunder.

The constraining layer 2 (2b) is arranged to correspond to three of the internal conductors 3 located thereabove.

The constraining layer 2 (2c) is arranged to correspond to two of the internal conductors 3 located thereunder.

In a region where the coplanarity of a substrate surface needs to be ensured, sufficient coplanarity is ensured due to the constraining layers 2 (2a, 2b, and 2c).

In the ceramic multilayer substrate according to a preferred embodiment of the present invention, when the internal conductor-overlapping region where at least two of the internal conductors overlap each other is present, the constraining layers do not necessarily have to be provided. The constraining layers 2 need not necessarily be provided in some cases depending on other wiring conductors or the like. That is, in consideration of overall balance, the constraining layers 2 can be arranged with a choice of a portion having a problem that the coplanarity of a substrate surface is reduced due to the overlap of the internal conductors. This allows the ceramic multilayer substrate, which is excellent in coplanarity, to be efficiently manufactured.

In the method for manufacturing the ceramic multilayer substrate according to the present preferred embodiment, the ceramic multilayer substrate preferably is individually manufactured as described above. The following method is preferably used in many cases: a multi-product manufacturing method in which an aggregate laminate including a plurality of ceramic multilayer substrates is formed and is then divided before or after firing such that the ceramic multilayer substrates are obtained.

In the case of using the multi-product manufacturing method, break lines for readily performing a subsequent dividing step are preferably formed on the aggregate laminate before firing.

In the first preferred embodiment, the unfired laminate is preferably formed by stacking the ceramic green sheets. The following method can be used: a method in which the unfired laminate is formed by repeating a step of applying slurry containing a substrate ceramic material powder.

In the ceramic multilayer substrate 10, manufactured as described above, according to the first preferred embodiment, the constraining layers 2, which contain the inorganic material powder substantially unsintered, are located on layers different from layers having the internal conductors 3 arranged thereon so as to overlap the internal conductor-overlapping region A in the stacking direction and therefore absorb the influence of the internal conductors 3 arranged with the ceramic layers 1 therebetween. As a result, the planarity (coplanarity) of a substrate surface can be ensured.

Since the planar area of the constraining layers 2 is not more than twice the planar area of the internal conductor-overlapping region A, large recesses are prevented from being caused in the ceramic layers 1 in the vicinity of the internal conductors 3 such that the ceramic multilayer substrate 10, which has no cracks and is excellent in coplanarity, can be obtained.

Figure 3:
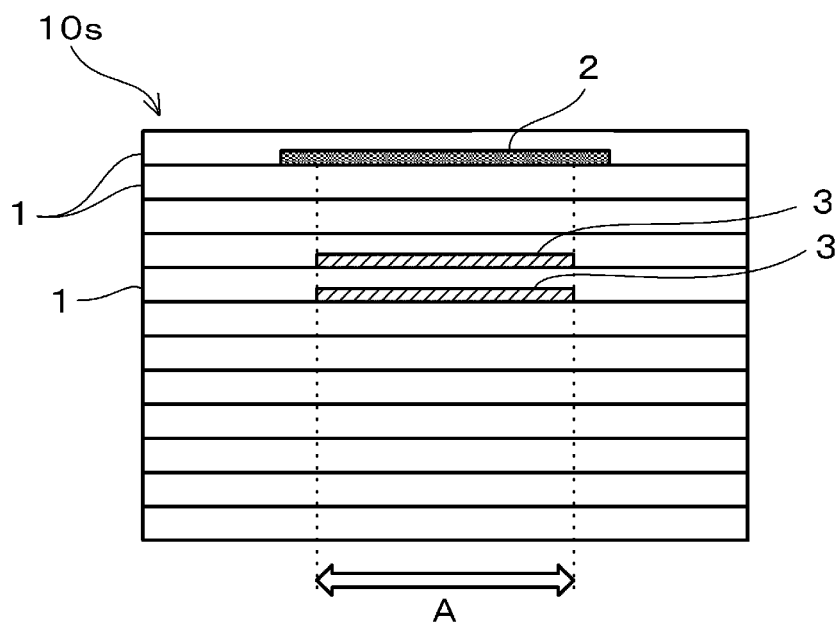
FIG. 3 is an illustration showing the configuration of a sample prepared for evaluating properties of a ceramic multilayer substrate according to preferred embodiments of the present invention.

In order to confirm effects of various preferred embodiments of the present invention, Samples 10s (Samples No. 2 to No. 6 in Table 1) have been prepared. As shown in FIG. 3, Samples 10s each include:

(a) 15 ceramic layers 1 with a thickness of 20 μm,
(b) two internal conductors 3 with a thickness of 10 μm, and
(c) a constraining layer 2 with a thickness of 2 μm.

The Samples 10s have a configuration in which the two internal conductors 3 are arranged at positions facing each other with one of the ceramic layers 1 therebetween, the constraining layer 2 is located above the internal conductors 3 with three of the ceramic layers 1 therebetween, and one of the ceramic layers 1 is located on the constraining layer 2. The ceramic layers 1 have a planar area (substrate area) of about 14 mm$^2$. Samples 10s are substrates prepared by firing and then cutting a 100-mm square aggregate substrate.

TABLE 1

| Sample number | Planar area of internal conductor (mm$^2$) | Planar area of constraining layer (mm$^2$) | Planar area of constraining layer/ area of internal conductor overlap | Coplanarity (μm) | Remarks |
|---|---|---|---|---|---|
| 1 | 2 | 0 | 0 | 75 | — |
| 2 | 2 | 0.5 | 0.25 | 44 | — |
| 3 | 2 | 1 | 0.5 | 35 | — |
| 4 | 2 | 2 | 1 | 22 | — |
| 5 | 2 | 3 | 1.5 | 20 | — |
| 6 | 2 | 4 | 2 | 26 | — |
| 7 | 2 | 5 | 2.5 | — | Recess caused in substrate |

Furthermore, the following samples have been prepared for comparison: a sample (Sample No. 1 in Table 1) including no constraining layer and a sample (Sample No. 7 in Table 1) including internal conductors 3 and a constraining layer 2 having a planar area that is more than twice the planar area of the internal conductors 3.

In order to evaluate coplanarity, each of Samples No. 1 to No. 7 in Table 1 has been measured for the difference (μm) in elevation between the lowest portion and highest portion of a substrate surface. Measurement results are shown in Table 1 in the form of coplanarity. The coplanarity is the average of the coplanarity of the Samples 10s obtained by cutting the aggregate substrate.

As shown in Table 1, the coplanarity of Sample No. 1 (comparative example), which includes no constraining layer, is more than about 70 μm. This confirms that sufficient coplanarity cannot be ensured in the case of using no constraining layer.

In Sample No. 7, since the planar area of the constraining layer 2 is more than twice the planar area of the internal conductors 3, the ceramic layers 1 around the internal conductor 3 are significantly recessed and have cracks.

The following samples have been prepared: samples (Samples No. 8 to No. 13 in Table 2) which have a configuration as shown in FIG. 3, in which the ratio of the planar area of an internal conductor-overlapping region A to the planar area of a constraining layer 2 is 1:1, in which the planar area of the internal conductors 3 and the planar area of the constraining layer 2 are varied, and in which the ratio of the planar area of the constraining layer 2 to the planar area of a ceramic layer (ceramic multilayer substrate) is varied. The samples in Table 2 include ceramic layers with a planar area (substrate area) of about 14 mm².

TABLE 2

| Sample number | Planar area of internal conductor (mm²) | Planar area of constraining layer (mm²) | Planar area of constraining layer/planar area of ceramic layer | Coplanarity (µm) | Non-linear strain (µm) | Warpage of substrate (µm) |
|---|---|---|---|---|---|---|
| 8 | 2 | 2 | 1/7 | 22 | 45 | 145 |
| 9 | 4 | 4 | 2/7 | 24 | 48 | 165 |
| 10 | 6 | 6 | 3/7 | 32 | 62 | 215 |
| 11 | 7 | 7 | 1/2 | 43 | 73 | 245 |
| 12 | 8 | 8 | 4/7 | 52 | 80 | 285 |
| 13 | 10 | 10 | 5/7 | 56 | 86 | 335 |

Samples No. 8 to No. 13 in Table 2 have been investigated for coplanarity (µm), non-linear strain (µm), and warpage (µm). The non-linear strain and the warpage are values obtained by measuring an aggregate substrate. The results are summarized in Table 2.

The non-linear strain (µm) is a value determined by a method below. The deviation from the theoretical value of each of the four sides of a sample is measured for X and Y. The value of one-half of the sum of the absolute value of the maximum deviation and that of the minimum deviation of X is compared to the value of one-half of the sum of the absolute value of the maximum deviation and that of the minimum deviation of Y. The value of a greater one is defined as the non-linear strain (µm).

When a laminate includes a constraining layer in a firing step, an obtained sintered body tends to have larger strain and warpage as compared to a laminate including no constraining layer. However, Samples No. 8 to No. 11 in which the planar area of a constraining layer is not more than one-half the planar area (substrate area) of a ceramic layer have small strain and warpage and are excellent in coplanarity as shown in Table 2.

On the other hand, Samples No. 12 and No. 13 in which the planar area of a constraining layer is more than one-half the planar area (substrate area) of a ceramic layer tend to have relatively large strain and warpage, which are within a practical use range, and also have slightly low coplanarity as shown in Table 2.

Furthermore, Samples No. 14 to No. 16 shown in Table 3 have been prepared such that the planar area of an internal conductor-overlapping region is equal to the planar area of a constraining layer and the proportion of overlap therebetween is varied by displacing the constraining layer. The samples in Table 3 include ceramic layers with a planar area (substrate area) of 14 mm².

Samples No. 14 to No. 16 have been investigated for coplanarity. The results are summarized in Table 3.

TABLE 3

| Sample number | Planar area of internal conductor (mm²) | Planar area of constraining layer (mm²) | Ratio of constraining layer to internal conductor-overlapping region | Coplanarity (µm) |
|---|---|---|---|---|
| 14 | 2 | 2 | 1 (whole surface) | 22 |
| 15 | 2 | 2 | ½ | 38 |
| 16 | 2 | 2 | ⅓ | 48 |

As shown in Table 3, the coplanarity of Sample No. 14 in which a constraining layer covers the whole surface of an internal conductor-overlapping region A is about 22 µm, which is particularly good, and Samples No. 15 and No. 16 in which a constraining layer covers a portion of an internal conductor-overlapping region A are improved in coplanarity.

In the ceramic multilayer substrate according to the first preferred embodiment, each constraining layer is preferably arranged in the portion which is one of the portions between the substrate surface and the internal conductors that are elements that should overlap each other in the stacking direction and in which the distance between the substrate surface and one of the internal conductors is relatively small and smaller than other such distances. As a result, the coplanarity can be reliably improved. That is, the coplanarity can be efficiently improved such that the constraining layer is arranged in the portion which is one of the portions between the substrate surface and the internal conductors that are elements that should overlap each other in the stacking direction and in which the distance between the substrate surface and one of the internal conductors is relatively small and smaller than other such distances, because convex bumps caused by the influence of the internal conductors are likely to be formed on a substrate surface closer to the internal conductors.

In various preferred embodiments of the present invention, the constraining layers are preferably arranged between the internal conductors with about three or four of the ceramic layers therebetween. This is because when about three or four of the ceramic layers are present between the internal conductors and the constraining layers, the deformation of the ceramic layers due to the overlap of the internal conductors is sufficiently and flexibly absorbed by the shrinkage of the ceramic layers in a thickness direction and therefore the coplanarity can be efficiently improved.

In various preferred embodiments of the present invention, two or more of the constraining layers may be arranged so as to overlap each other as required. In this case, the ability to absorb the deformation of the ceramic layers can be increased.

The constraining layers are preferably not provided at positions corresponding to the outermost layers of the ceramic multilayer substrate. This is because the ceramic layers and the constraining layers are different in material from each other, the bonding strength therebetween is likely to be insufficient, a surface of the ceramic multilayer substrate may possibly be subjected to external forces, and cracks or fractures are likely to be caused.

The constraining layers are preferably arranged so as not to be in contact with the internal conductors. This is because a state in which, for example, one of two of the internal conductors is in contact with the constraining layer and the other one is in contact with the ceramic layers may possibly be caused, that is, lifting may possibly be caused on the internal conductor because of the difference in each rate of shrinkage and sintering shrinkage behavior in upper and lower portions.

Second Preferred Embodiment

Figure 4:
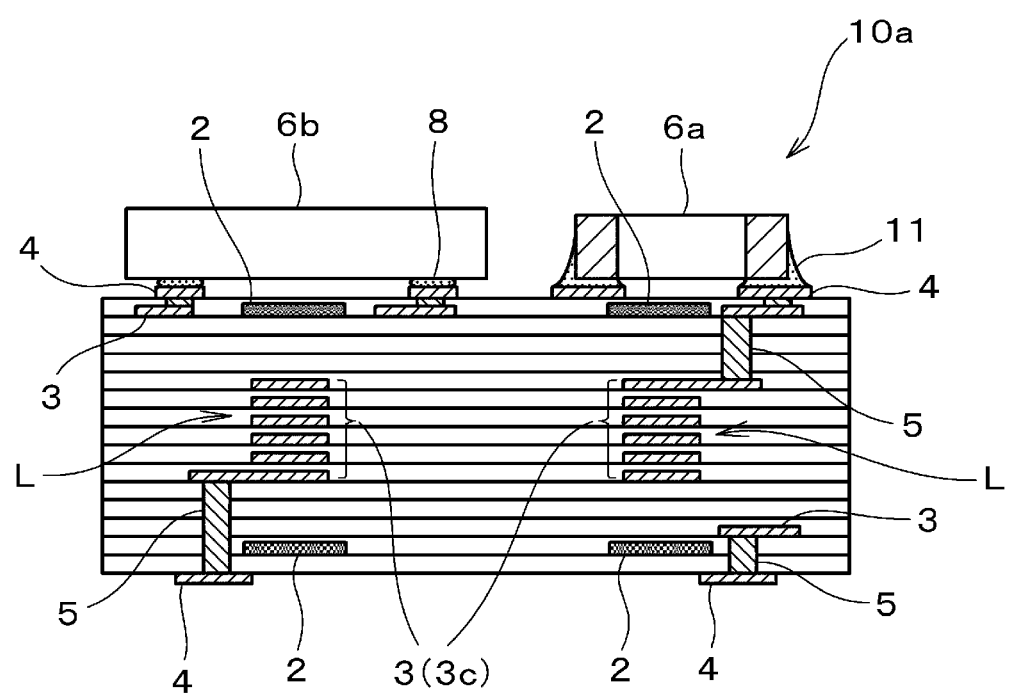
FIG. 4 is a schematic view illustrating the configuration of a ceramic multilayer substrate according to a second preferred embodiment of the present invention.

FIG. 4 is a front sectional view illustrating the configuration of a ceramic multilayer substrate according to another preferred embodiment (a second preferred embodiment) of the present invention.

The ceramic multilayer substrate 10a includes ceramic layers 1 that are base layers, internal conductors 3 located between the layers, external conductors 4 located on surfaces, and via-hole conductors 5 for interlayer connection. The internal conductors 3 and external conductors 4 located on different layers are electrically connected to each other through the via-hole conductors 5.

The internal conductors 3 (3c) which are located in a thicknesswise central region of the ceramic multilayer substrate 10a and which overlap each other in a stacking direction are coil conductors that are connected to each other through via-hole conductors, which are not shown, to define a coil L.

In the ceramic multilayer substrate 10a, the ceramic layers 1 are preferably made of, for example, a ferrite ceramic. Non-limiting examples of the ferrite ceramic include Fe—Ni—Zn—Cu compositions, Fe—Zn—Cu compositions, and Fe—Mn—Zn compositions.

In the ceramic multilayer substrate 10a, all of the ceramic layers 1 may be made of the ferrite ceramic. Alternatively, only some of the ceramic layers that define a portion in which the coil L, which includes the internal conductors 3 (3c), is located, are made of the ferrite ceramic and the other ceramic layers may be made of a dielectric ceramic or an insulating ceramic.

In the ceramic multilayer substrate 10a, constraining layers 2 containing an inorganic material powder which is substantially unsintered are located on layers which are different from the internal conductors 3 and which are close to a substrate surface so as to overlap the internal conductors 3 (3c) defining the coil L in the stacking direction.

With reference to FIG. 4, a surface-mount electronic component 6a is mounted on a surface of the ceramic multilayer substrate 10 with a solder 11 therebetween and a semiconductor element 6b is mounted thereon with solder balls 8 therebetween.

In the second preferred embodiment, for the ceramic multilayer substrate 10a, in which the coil L is formed preferably by arranging the internal conductors 3 (3c), that is, the coil conductors, the coil conductors (internal conductors) 3 (3c) having the same shape are arranged so as to overlap each other in the stacking direction and therefore a region of a substrate surface that corresponds to a region where the coil conductors (internal conductors) 3 (3c) are located is likely to protrude and is likely to be convex. However, a ceramic multilayer substrate that is excellent in coplanarity can be obtained by the application of the present preferred embodiment of the present invention. This is significantly advantageous.

The present invention is not limited to the first preferred embodiment or the second preferred embodiment. Various modifications and variations can be made to the number of ceramic layers included in a ceramic multilayer substrate; the arrangement of constraining layers, internal conductors, or the like; materials used to form the ceramic layers, internal conductors, constraining layers, and the like; and detailed conditions of steps of manufacturing the ceramic multilayer substrate within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic multilayer substrate comprising:
   a plurality of stacked ceramic layers;
   a plurality of internal conductors which are stacked on each other with a respective one of the ceramic layers between adjacent pairs of the plurality of internal conductors, the plurality of internal conductors being arranged such that at least a portion of the plurality of internal conductors overlap each other in a stacking direction; and
   at least one constraining layer which is located on a layer different from layers on which the internal conductors are located; wherein
   the at least one constraining layer is arranged to overlap, in a stacking direction, an internal conductor-overlapping region where at least two of the internal conductors overlapping each other in the stacking direction overlap each other;
   the at least one constraining layer includes a planar area that is not more than twice a planar area of an internal conductor-overlapping region;
   the at least one constraining layer contains an inorganic material powder that is not sintered;
   the at least one constraining layer has a planar area that is not more than one-half of a planar area of the ceramic layers;
   the at least one constraining layer is made of a different material from a material from which the plurality of internal conductors are made; and
   the at least one constraining layer has a thickness less than a thickness of each of the plurality of internal conductors.

2. The ceramic multilayer substrate according to claim 1, wherein the at least one constraining layer is arranged so as to entirely cover the internal conductor-overlapping region in the stacking direction.

3. The ceramic multilayer substrate according to claim 1, wherein the at least one constraining layer is located in a portion which is one of a plurality of portions between a substrate surface and the internal conductors that are elements that should overlap each other in the stacking direction and in which the distance between the substrate surface and one of the internal conductors is smaller than other such distances.

4. The ceramic multilayer substrate according to claim 1, wherein the internal conductors overlapping each other in the stacking direction are coil conductors.

5. The ceramic multilayer substrate according to claim 1, wherein the ceramic layers are made of a ceramic material containing a glass component.

6. The ceramic multilayer substrate according to claim 1, wherein the at least one constraining layer includes three constraining layers arranged at three different locations.

7. The ceramic multilayer substrate according to claim 6, wherein the number of the internal conductors is three, and each of the three constraining layers is arranged to correspond to a respective location of one of the three internal conductors.

8. The ceramic multilayer substrate according to claim 6, wherein each of the three constraining layers includes a planar area that is not more than twice a planar area of an internal conductor-overlapping region.

9. The ceramic multilayer substrate according to claim 1, further comprising a surface mount electronic component and a semiconductor element mounted on a surface of the ceramic multilayer substrate.

10. The ceramic multilayer substrate according to claim 1, wherein the inorganic material powder of the at least one constraining layer includes alumina, zirconia, magnesia, mullite, quartz or boron nitride.

11. The ceramic multilayer substrate according to claim 1, wherein the at least one constraining layer is not located at a position corresponding to an outermost layer of the ceramic multilayer substrate.

12. The ceramic multilayer substrate according to claim 1, wherein the at least one constraining layer is arranged so as not to contact the internal conductors.

13. The ceramic multilayer substrate according to claim 6, wherein the constraining layers are arranged between the internal conductors with at least three of the ceramic layers disposed therebetween.

14. The ceramic multilayer substrate according to claim 6, wherein the constraining layers are arranged to overlap with each other in the stacking direction.

15. The ceramic multilayer substrate according to claim 1, further comprising external conductors and via hole conductors, wherein the internal conductors and the external conductors are connected to each other through the via hole conductors.

16. The ceramic multilayer substrate according to claim 15, wherein the internal conductors are located in a thickness-wise central region of the ceramic multilayer substrate and overlap each other in the stacking direction, and the internal conductors are connected to each other to define a coil.

17. The ceramic multilayer substrate according to claim 16, wherein the at least one constraining layer includes at least three constraining layers located on layers different from layers on which the internal conductors are located and overlapping the internal conductors that define the coil.

18. A method for manufacturing a ceramic multilayer substrate, comprising the steps of:
(a) preparing a green laminate including:
    a plurality of substrate ceramic green layers containing a substrate ceramic material powder;
    internal conductors formed on at least two of the substrate ceramic green layers, and at least a portion of one of the internal conductors formed on one of the substrate ceramic green layer overlaps another internal conductor formed on another substrate ceramic green layer in a stacking direction; and
    at least one constraining layer which is formed on a layer different from layers on which the internal conductors are formed, the at least one constraining layers overlapping, in the stacking direction, an internal conductor-overlapping region where at least two of the internal conductors overlapping each other in the stacking direction overlap each other, the at least one constraining layer including a planar area that is not more than twice the planar area of the internal conductor-overlapping region, the at least one constraining layer including an inorganic material powder that is not sintered at the sintering temperature of the substrate ceramic material powder, the at least one constraining layer has a planar area that is not more than one-half of a planar area of the ceramic layers; and the at least one constraining layer has a thickness less than a thickness of each of the plurality of internal conductors; and
(b) firing the green laminate at a temperature at which the inorganic material powder is not sintered but the substrate ceramic material powder is sintered.

19. The ceramic multilayer substrate-manufacturing method according to claim 18, wherein the constraining layer is formed by applying an inorganic material paste containing the inorganic material powder to the substrate ceramic green layer.

* * * * *